United States Patent
Lee et al.

(10) Patent No.: US 9,349,488 B2
(45) Date of Patent: May 24, 2016

(54) SEMICONDUCTOR MEMORY APPARATUS

(71) Applicant: SK hynix Inc., Icheon-si Gyeonggi-do (KR)

(72) Inventors: Chang Hyun Lee, Icheon-si (KR); Young Jun Ku, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/495,988

(22) Filed: Sep. 25, 2014

(65) Prior Publication Data
US 2015/0332787 A1    Nov. 19, 2015

(30) Foreign Application Priority Data
May 13, 2014    (KR) .................. 10-2014-0057132

(51) Int. Cl.
| G11C 29/56 | (2006.01) |
|---|---|
| G11C 29/02 | (2006.01) |
| G11C 29/50 | (2006.01) |
| G11C 29/12 | (2006.01) |

(52) U.S. Cl.
CPC ........ *G11C 29/12015* (2013.01); *G11C 29/023* (2013.01); *G11C 29/56* (2013.01); *G11C 29/12* (2013.01); *G11C 29/50012* (2013.01); *G11C 2029/5602* (2013.01)

(58) Field of Classification Search
CPC .............. G11C 29/028; G11C 2207/2254; G11C 29/023; G11C 7/1072; G11C 7/1078; G11C 5/04; G11C 29/12; G11C 2029/5602; G11C 29/50012; G11C 29/56
USPC ....................................................... 714/718
See application file for complete search history.

(56) References Cited

U.S. PATENT DOCUMENTS

| 6,097,206 A * | 8/2000 | Takano ................. G11C 29/56 324/762.01 |
|---|---|---|
| 6,349,399 B1 * | 2/2002 | Manning .............. G11C 7/1072 714/739 |
| 6,842,864 B1 * | 1/2005 | Barth .................... G06F 1/3225 365/233.17 |
| 6,912,680 B1 * | 6/2005 | Keeth .................. G11C 7/1051 713/401 |
| 7,603,605 B2 * | 10/2009 | Mittal .................... G11C 29/02 714/745 |
| 7,650,555 B2 * | 1/2010 | Imming ............. G01R 31/2834 714/25 |
| 7,673,193 B1 * | 3/2010 | Ong ....................... G11C 29/56 324/762.02 |
| 7,694,202 B2 * | 4/2010 | Swanson et al. ..... G11C 7/1072 714/738 |
| 7,872,940 B2 * | 1/2011 | Kwean ............... G11C 29/1201 365/189.05 |
| 2002/0004922 A1 * | 1/2002 | Manning .............. G11C 7/1072 714/720 |
| 2005/0204245 A1 * | 9/2005 | Lee et al. ......... G01R 31/31937 714/744 |
| 2008/0168408 A1 * | 7/2008 | Mittal .................... G11C 29/02 714/745 |
| 2009/0013228 A1 * | 1/2009 | Jarboe, Jr. .......... G01R 31/3187 714/733 |
| 2013/0055039 A1 * | 2/2013 | Dearth .................. G06F 7/584 714/720 |

FOREIGN PATENT DOCUMENTS

| KR | 1020020010545 A | 2/2002 |
|---|---|---|
| KR | 1020090061843 A | 6/2009 |

* cited by examiner

*Primary Examiner* — James C Kerveros
(74) *Attorney, Agent, or Firm* — William Park & Associates Ltd.

(57) ABSTRACT

A semiconductor memory apparatus includes a plurality of data storage regions; a first internal circuit configured to input a plurality of control signals to the plurality of data storage regions; and a second internal circuit configured to control input timing of a test control signal, and input the test control signal to the plurality of data storage regions according to the controlled input timing in response to a test mode signal.

15 Claims, 6 Drawing Sheets

113 - Delay Control Unit
110 - First Semiconductor Die
120 - Second Semiconductor Die
130 - Third Semiconductor Die
140 - Fourth Semiconductor Die
300 - Controller
200 - Interposer
111 - First interface
112 - Second Interface

SEMICONDUCTOR MEMORY APPARATUS

CROSS-REFERENCES TO RELATED APPLICATION

The present application claims priority under 35 U.S.C. §119(a) to Korean application number 10-2014-0057132, filed on May 13, 2014, in the Korean Intellectual Property Office, which is incorporated herein by reference in its entirety as set forth in full.

BACKGROUND

1. Technical Field

Various embodiments relate to a semiconductor integrated circuit, and more particularly, to a semiconductor memory apparatus.

2. Related Art

Stacking semiconductor dies is developed as capacity of a semiconductor memory apparatus becomes greater. Also, response speed is improved by making each of the stacked dies to independently operate.

However, it is hard to test such semiconductor memory apparatus because there is more limitation of a number of pins to test each of the semiconductor dies after stacking than to test individual semiconductor die. Therefore, it is hard to perform different tests on each of stacked semiconductor dies included in a semiconductor memory apparatus such as when the semiconductor memory apparatus operates in normal condition.

SUMMARY

In an embodiment of the invention, a semiconductor memory apparatus may include a plurality of data storage regions and a first internal circuit configured to input a plurality of control signals to the plurality of data storage regions. The semiconductor memory apparatus may also include a second internal circuit configured to control input timing of a test control signal, and input the test control signal to the plurality of data storage regions according to the controlled input timing in response to a test mode signal.

In an embodiment of the invention, a semiconductor memory apparatus may include a plurality of data storage regions and a normal signal transfer path configured to set operation modes to each of the plurality of data storage regions. In addition, the semiconductor memory apparatus may include a test signal transfer path configured to control the plurality of data storage regions to allow the plurality of data storage regions to perform operations with the same pattern while the plurality of data storage regions perform different operations to each other at the same time in a test mode.

In an embodiment of the invention, a semiconductor memory apparatus may include a plurality of stacked semiconductor dies. In addition, one of the plurality of stacked semiconductor dies comprises a first interface electrically configured to individually set operation mode of each of the plurality of stacked semiconductor dies under control of a controller in a normal mode. Further, the one of the plurality of stacked semiconductor dies may also comprise a second interface configured to receive a test control signal from an external test device and delay the test control signal with different delay amounts for each of the plurality of stacked semiconductor dies. The second interface may also input the delayed test control signal to each of the plurality of stacked semiconductor dies in a test mode.

DETAILED DESCRIPTION

Hereinafter, a semiconductor apparatus will be described below with reference to the accompanying figures through various embodiments.

Figure 1:
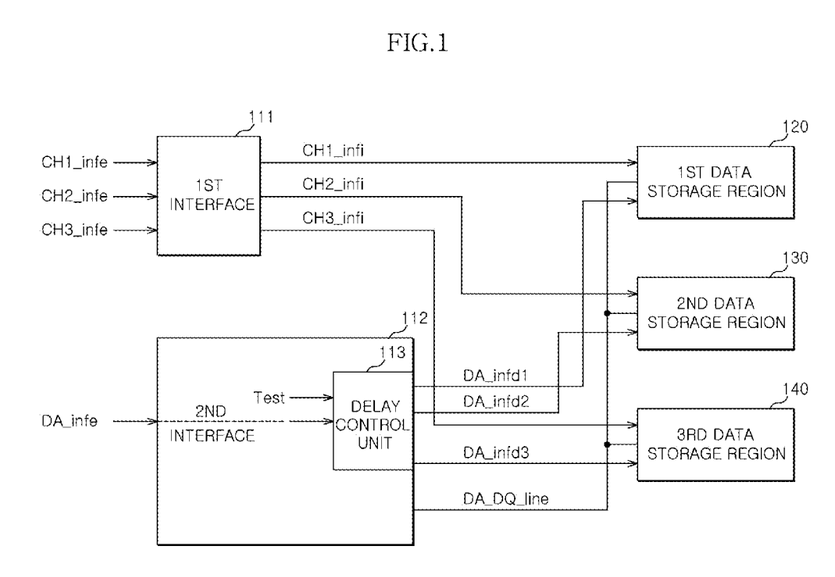
FIG. 1 is a block diagram illustrating a semiconductor memory apparatus in accordance with an embodiment of the invention.

Referring to FIG. 1, a semiconductor memory device in accordance with an embodiment may include a first interface 111, a second interface 112, and first to third data storage regions 120, 130, and 140. One or more of the first and second interfaces 111 and 112 may include all internal circuits to receive and transmit signals in the semiconductor memory apparatus. The first and second interfaces 111 and 112 may represent internal circuits.

The first interface 111 may transfer first to third control signals CH1_infi, CH2_infi, and CH3_infi to the first to third data storage regions 120, 130, and 140. For example, the first interface 111 may be electrically coupled to a controller 300 shown in FIG. 5. The first interface 111 may also receive the first to third external control signals CH1_infe, CH2_infe, and CH3_infe from the controller 300. The first interface 111 may also output the first to third external control signals CH1_infe, CH2_infe, and CH3_infe as the first to third control signals CH1_infi, CH2_infi, and CH3_infi to the first to third data storage regions 120, 130, and 140. Each of the first to third control signals CH1_infi, CH2_infi, and CH3_infi may be a signal (clock, address, and command) to set operations of the first to third data storage regions 120, 130, and 140.

The second interface 112 may be electrically coupled to an external test device, receive a test control signal DA_infe from the external test device, and output the test control signal DA_infe to the first to third data storage regions 120, 130, and 140 with different output timing. The test control signal DA_infe transferred to the first data storage region 120 is referred to as a first delay test control signal DA_infd1. The test control signal DA_infe transferred to the second data storage region 130 is referred to as a second delay test control signal DA_infd2. In addition, the test control signal DA_infe transferred to the third data storage region 140 is referred to as a third delay test control signal DA_infd3. The first to third delay test control signals DA_infd1, DA_infd2, and DA_infd3 may be respectively delayed test control signal DA_infe with different delay. In detail, the second interface 112 may include a delay control unit 113. The delay control unit 113 may output the first to third delay test control signals DA_infd1, DA_infd2, and DA_infd3 with different delays by delaying the test control signal DA_infe with a different delay in response to a test mode signal TEST. In addition, the second interface 112 may transmit and receive data using a test data line DA_DQ_line commonly coupled to the first to third data storage regions 120, 130, and 140.

The first data storage region 120 may operate in response to the first control signal CH1_infi and the first delay test control signal DA_infd1. For instance, the first data storage region 120 may perform active, write, precharge, read, and refresh operations in response to each of the first control signal CH1_infi and the first delay test control signal DA_infd1.

The second data storage region 130 may operate in response to the second control signal CH2_infi and the second delay test control signal DA_infd2. For example, the second data storage region 130 may perform active, write, precharge, read, and refresh operations in response to the second control signal CH2_infi and the second delay test control signal DA_infd2.

The third data storage region 140 may operate in response to the third control signal CH3_infi and the third delay test control signal DA_infd3. For instance, the third data storage region 140 may perform active, write, precharge, read, and refresh operations in response to the third control signal CH3_infi and the third delay test control signal DA_infd3. Each of the first to third data storage regions 120, 130, and 140 may form different channels to perform different operations.

Figure 2:
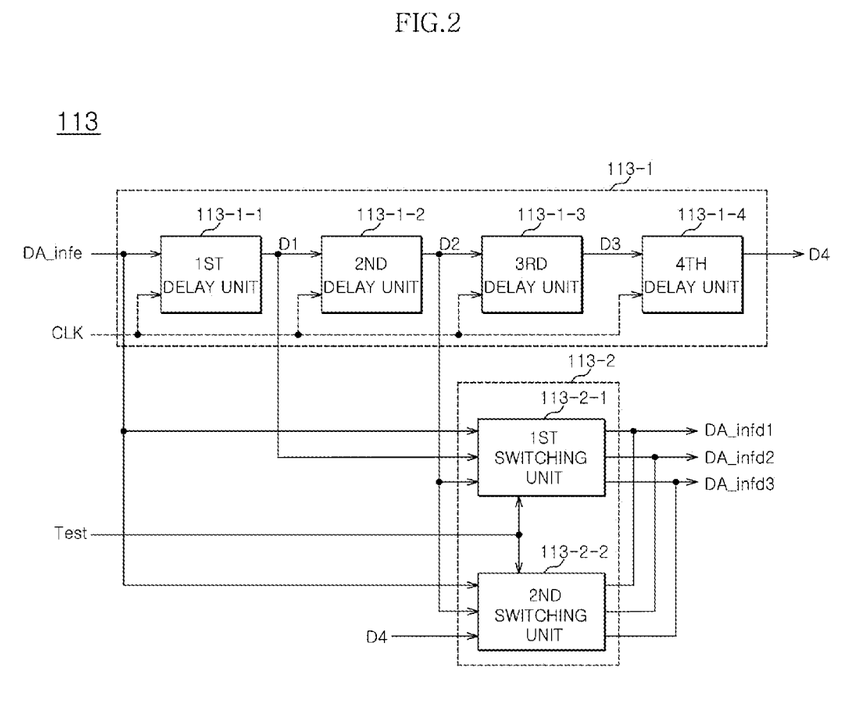
FIG. 2 is a block diagram illustrating a delay control unit shown in FIG. 1.

Referring to FIG. 2, the delay control unit 113 may include a delay chain 113-1 and a selection part 113-2.

The delay chain 113-1 may include first to fourth delay units 113-1-1, 113-1-2, 113-1-3, and 113-1-4, electrically coupled in series. The first delay unit 113-1-1 may receive and delay the test control signal DA_infe, and output a first delay signal D1. The second delay unit 113-1-2 may receive and delay the first delay signal D1, and output a second delay signal D2. The third delay unit 113-1-3 may receive and delay the second delay signal D2, and output a third delay signal D3. The fourth delay unit 113-1-4 may receive and delay the third delay signal D3, and output a fourth delay signal D4. The first to fourth delay units 113-1-1, 113-1-2, 113-1-3, and 113-1-4 may be a synchronous delay unit such as a flip-flop to delay an input signal in response to a clock CLK, or a plurality of inverters serially coupled or an RC delay circuit to delay an input signal without synchronization to a clock CLK.

The selection part 113-2 may select each of the output signals D1, D2, D3, and D4 of the first to fourth delay units 113-1-1, 113-1-2, 113-1-3, and 113-1-4. The selection part 113-2 may also output the selected signals to the first to third data storage regions 120, 130, and 140 in response to the test mode signal TEST.

The selection part 113-2 may include first and second switching units 113-2-1, and 113-2-2.

The first switching unit 113-2-1 may output the test control signal DA_infe, the first delay signal D1, and the second delay signal D2 as the first delay test control signal DA_infd1, the second delay test control signal DA_infd2, and the third delay test control signal DA_infd3 respectively in response to the test mode signal TEST. For example, the first switching unit 113-2-1 may output the test control signal DA_infe as the first delay test control signal DA_infd1. The first switching unit 113-2-1 may also output the first delay signal D1 as the second delay test control signal DA_infd2. Further, the first switching unit 113-2-1 may also output the second delay signal D2 as the third delay test control signal DA_infd3 when the test mode signal TEST is enabled.

The second switching unit 113-2-2 may output the test control signal DA_infe, the second delay signal D2, and the fourth delay signal D4 as the first delay test control signal DA_infd1, the second delay test control signal DA_infd2, and the third delay test control signal DA_infd3, respectively in response to the test mode signal TEST. For example, the second switching unit 113-2-2 may output the test control signal DA_infe as the first delay test control signal DA_infd1. The second switching unit 113-2-2 may also output the second delay signal D2 as the second delay test control signal DA_infd2. In addition, the second switching unit 113-2-2 may output the fourth delay signal D4 as the third delay test control signal DA_infd3 when the test mode signal TEST is disabled.

Figure 3:
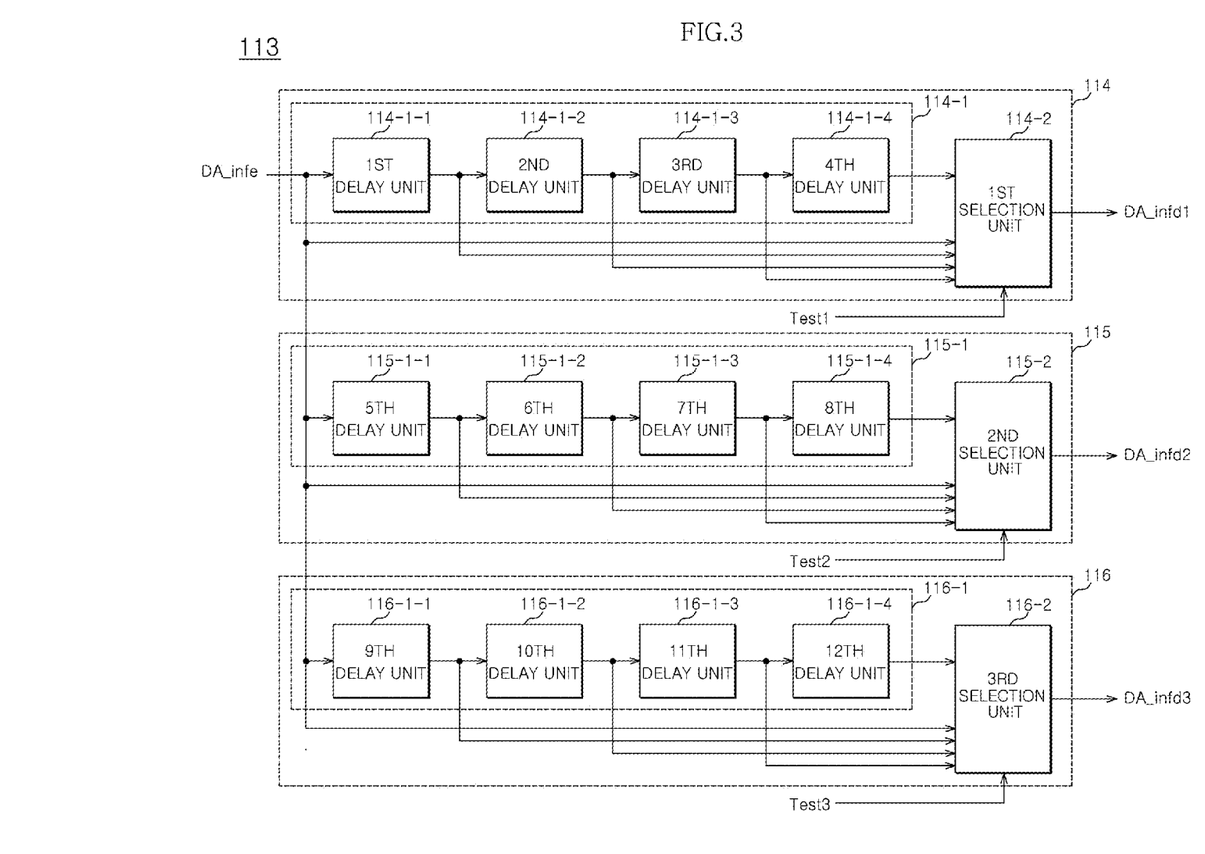
FIG. 3 is a block diagram illustrating a delay control unit shown in FIG. 1.

Referring to FIG. 3, an embodiment of the delay control unit 113 is shown. The delay control unit 113 may include first to third selection and output parts 114, 115, and 116.

The first selection and output part 114 may include a first delay chain 114-1, and a first selection unit 114-2. The first delay chain 114-1 may include first to fourth delay units 114-1-1, 114-1-2, 114-1-3, and 114-1-4 electrically coupled in series. The first delay unit 114-1-1 may receive and delay the test control signal DA_infe. The second delay unit 114-1-2 may receive and delay an output of the first delay unit 114-1-1. The third delay unit 114-1-3 may receive and delay an output of the second delay unit 114-1-2. The fourth delay unit 114-1-4 may receive and delay an output of the third delay unit 114-1-3. The first selection unit 114-2 may output one of the outputs of the first to fourth delay units 114-1-1, 114-1-2, 114-1-3, and 114-1-4, and the test control signal DA_infe as the first delay test control signal DA_infd1 according to a first test mode signal TEST1.

The second selection and output part 115 may include a second delay chain 115-1, and a second selection unit 115-2. The second delay chain 115-1 may include fifth to eighth delay units 115-1-1, 115-1-2, 115-1-3, and 115-1-4 electrically coupled in series. The fifth delay unit 115-1-1 may receive and delay the test control signal DA_infe. The sixth delay unit 115-1-2 may receive and delay an output of the fifth delay unit 115-1-1. The seventh delay unit 115-1-3 may receive and delay an output of the sixth delay unit 115-1-2. The eighth delay unit 115-1-4 may receive and delay an output of the seventh delay unit 115-1-3. The second selection unit 115-2 may output one of the outputs of the fifth to eighth delay units 115-1-1, 115-1-2, 115-1-3, and 115-1-4, and the test control signal DA_infe as the second delay test control signal DA_infd2 in response to a second test mode signal TEST2.

The third selection and output part 116 may include a third delay chain 116-1, and a third selection unit 116-2. The third delay chain 116-1 may include ninth to twelfth delay units 116-1-1, 116-1-2, 116-1-3, and 116-1-4 electrically coupled in series. The ninth delay unit 116-1-1 may receive and delay the test control signal DA_infe. The tenth delay unit 116-1-2 may receive and delay an output of the ninth delay unit 116-1-1. The eleventh delay unit 116-1-3 may receive and delay an output of the tenth delay unit 116-1-2. The twelfth delay unit 116-1-4 may receive and delay an output of the eleventh delay unit 116-1-3. The third selection unit 116-2 may output one of the outputs of the ninth to twelfth delay units 116-1-1, 116-1-2, 116-1-3, and 116-1-4, and the test control signal DA_infe as the third delay test control signal DA_infd3 according to a third test mode signal TEST3.

An operation of the semiconductor memory apparatus in accordance with an embodiment is as follows.

Control operation to the first to third data storage regions 120, 130, and 140 through the first interface 111 is as follows. A signal transfer path to control the first to third data storage regions 120, 130, and 140 through the first interface 111 is referred to as a normal signal transfer path.

The first to third external control signals CH1_infe, CH2_infe, and CH3_inf3 inputted from an external system or the like may be output through the first interface 111 as the first to third control signals CH1_infi, CH2_infi, and CH3_infi.

The first data storage region 120 may perform operations related to data storage, data output, and data maintenance such as active, write, precharge, read, and refresh operations according to the first control signal CH1_infi.

The second data storage region 130 may perform operations related to data storage, data output, and data maintenance such as active, write, precharge, read, and refresh operations in response to the second control signal CH2_infi.

The third data storage region 140 may perform operations related to data storage, data output, and data maintenance such as active, write, precharge, read, and refresh operations according to the third control signal CH3_infi.

Control operation to the first to third data storage regions 120, 130, and 140 through the second interface 112 is as follows. A signal transfer path to control the first to third data storage regions 120, 130, and 140 through the second interface 112 is referred to as a test signal transfer path.

The test control signal DA_infe may be inputted from an external to the second interface 112, and outputted as the first to third delay test control signals DA_infd1, DA_infd2, and DA_infd3. The second interface 112 may be configured to determine a delay amount for the test control signal DA_infe. The second interface 112 may also output the first to third delay test control signals DA_infd1, DA_infd2, and DA_infd3 by delaying the test control signal DA_infe with the determined delay amount in response to the test mode signal TEST. The first to third delay test control signals DA_infd1, DA_infd2, and DA_infd3 may be respectively delayed test control signal DA_infe with the same or different delay.

A process to generate the first to third delay test control signals DA_infd1, DA_infd2, and DA_infd3 by delaying the test control signal DA_infe in response to the test mode signal TEST will be described with reference to FIGS. 2 and 3.

Referring to FIG. 2, the test control signal DA_infe may be inputted to the delay chain 113-1. The delay chain 113-1 may include the first to fourth delay units 113-1-1, 113-1-2, 113-1-3, and 113-1-4 electrically coupled in series. The first switching unit 113-2-1 may output the test control signal DA_infe as the first delay test control signal DA_infd1. The first switching unit 113-2-1 may also output the first delay signal D1, which is the output of the first delay unit 113-1-1, as the second delay test control signal DA_infd2. Further, the first switching unit 113-2-1 may output the second delay signal D2, which is the output of the second delay unit 113-1-2, as the third delay test control signal DA_infd3 when the test mode signal TEST is enabled. The second switching unit 113-2-2 may output the test control signal DA_infe as the first delay test control signal DA_infd1. In addition, the second switching unit 113-2-2 may output the second delay signal D2, which is the output of the second delay unit 113-1-2, as the second delay test control signal DA_infd2. The second switching unit 113-2-2 may also output the fourth delay signal D4, which is the output of the fourth delay unit 113-1-4, as the third delay test control signal DA_infd3 when the test mode signal TEST is disabled.

More specifically, the delay control unit 113, which may be included in the second interface 112 shown in FIG. 2, may respectively input the first to third delay test control signals DA_infd1, DA_infd2, and DA_infd3 to the first to third data storage regions 120, 130, and 140 with a delay amount corresponding to a single delay unit. In the alternative, the delay amount may correspond to two delay units according to the test mode signal TEST.

Referring to FIG. 3, the test control signal DA_infe may be inputted to the first to third delay chains 114-1, 115-1, and 116-1. Each of the first to third delay chains may include four delay units 114-1-1 to 114-1-4, 115-1-1 to 115-1-4, and 116-1-1 to 116-1-4, respectively. The first selection unit 114-2 may select one of the outputs of the first to fourth delay units 114-1-1, 114-1-2, 114-1-3, and 114-1-4 included in the first delay chain 114-1, and the test control signal DA_infe. The first selection unit 114-2 may also output the selected signal as the first delay test control signal DA_infd1 in response to the first test mode signal TEST1. The second selection unit 115-2 may select one of the outputs of the fifth to eighth delay units 115-1-1, 115-1-2, 115-1-3, and 115-1-4 included in the second delay chain 115-1, and the test control signal DA_infe. The second selection unit 115-2 may also output the selected signal as the second delay test control signal DA_infd2 in response to the second test mode signal TEST2. The third selection unit 116-2 may output one of the outputs of the ninth to twelfth delay units 116-1-1, 116-1-2, 116-1-3, and 116-1-4 included in the third delay chain 116-1, and the test control signal DA_infe. The third selection unit 116-2 may also output the selected signal as the third delay test control signal DA_infd3 in response to the third test mode signal TEST3.

More specifically, the delay control unit 113, which may be included in the second interface 112 shown in FIG. 3, may determine delay amounts for the test control signal DA_infe. Further, the delay control unit 113 may output the first to third delay test control signals DA_infd1, DA_infd2, and DA_infd3 by delaying the test control signal DA_infe with the determined delay amounts in response to the first to third test mode signals TEST1, TEST2, and TEST3, respectively. In other words, the delay amounts of the first to third delay test control signals DA_infd1, DA_infd2, and DA_infd3 may be the same or may be different from each other. Therefore, the input timing of the first to third delay test control signals DA_infd1, DA_infd2, and DA_infd3 to the corresponding first to third data storage regions 120, 130, and 140 may be the same or may be different from each other.

Figure 4:
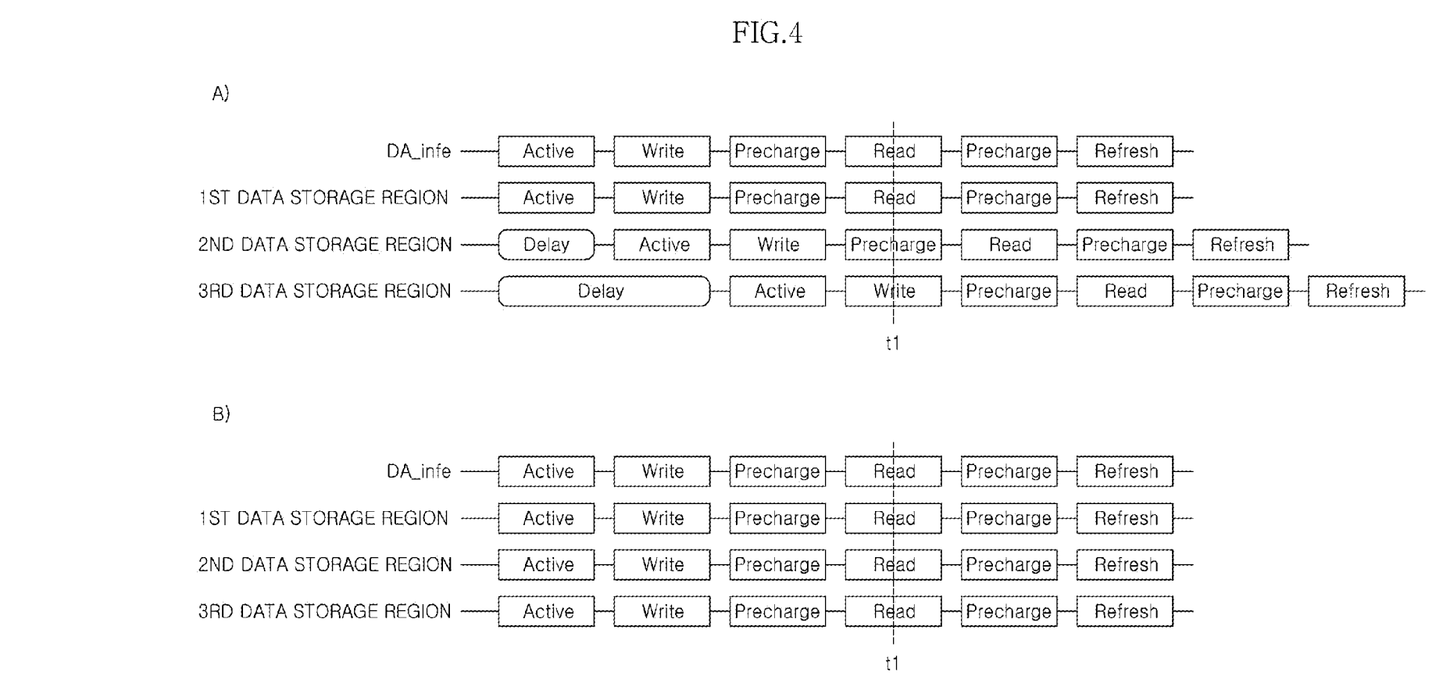
FIG. 4 is a timing diagram illustrating an operation of a semiconductor memory apparatus in accordance with an embodiment of the invention.

According to an embodiment, the first to third data storage regions 120, 130, and 140 may perform different operations from each other at a time point such as T1 shown in FIG. 4, by controlling input timing of the test control signal DA_infe, which is to control operations of the first to third data storage regions 120, 130, and 140, to the first to third data storage regions 120, 130, and 140. In addition, the first to third data storage regions 120, 130, and 140 may perform the same operation.

Referring to FIG. 4, it is assumed that the test control signal DA_infe is inputted to the first to third data storage regions 120, 130, and 140 for sequential active, write, precharge, read, precharge, and refresh operations of the first to third data storage regions 120, 130, and 140 in order.

Referring to FIG. 4 A), each of the first to third data storage regions 120, 130, and 140 may sequentially perform active, write, precharge, read, precharge, and refresh operations, while the second data storage region 130 may perform the operations later than the first data storage region 120. In addition, the third data storage region 140 may perform the operations later than the second data storage region 130. When seen at a specific time point T1, the first data storage region 120 may perform the read operation. In addition, the second data storage region 130 may perform the precharge operation. Further, the third data storage region 140 may perform the write operation. That is, the first to third data storage regions 120, 130, and 140 may perform different operations to each other. In addition, the first to third data storage regions 120, 130, and 140 may perform the read operation at different time point to each other. Accordingly results of the read operations of the first to third data storage regions 120, 130, and 140 may be sequentially obtained through the common test data line DA_DQ_line shown in FIG. 1.

Referring to FIG. 4 B), the test control signal DA_infe is inputted to the first to third data storage regions 120, 130, and 140 without delay. Therefore, the first to third data storage regions 120, 130, and 140 perform the same operation at a specific time point T1.

As such, a plurality of data storage regions of the semiconductor memory apparatus in accordance with an embodiment may have the same operation pattern, for example sequential order of the active, write, precharge, read, precharge, and refresh operations, with different operation timing from each other. Accordingly, the plurality of data storage regions may perform different operations from each other at a specific time point.

Figure 5:
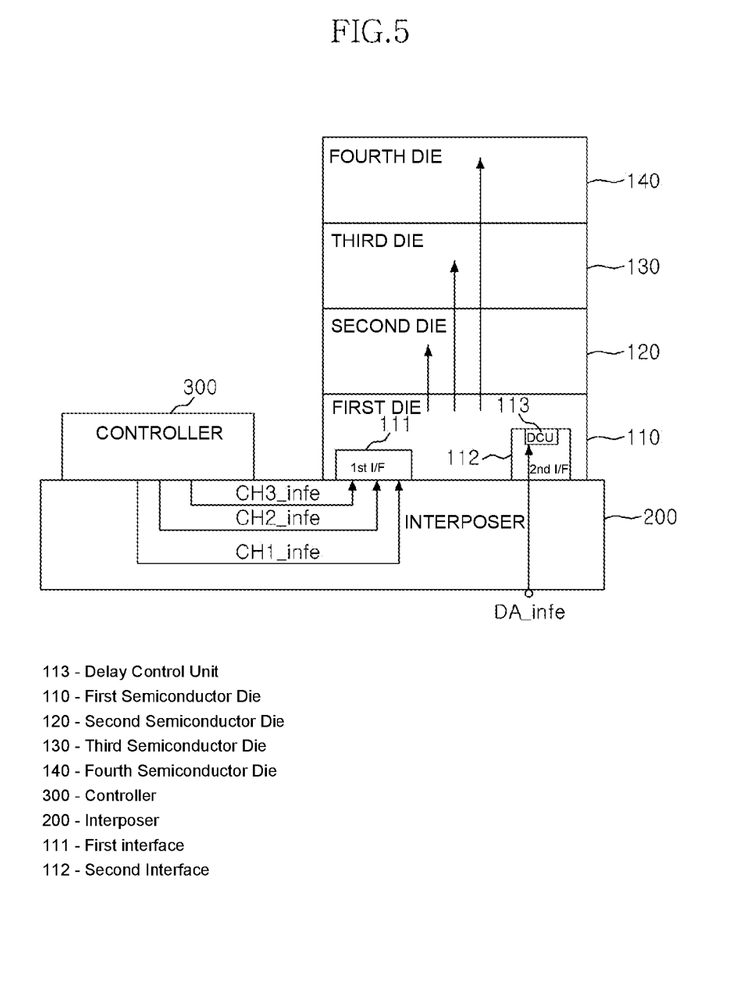
FIG. 5 is a schematic diagram illustrating a semiconductor memory apparatus in accordance with an embodiment of the invention.

Referring to FIG. 5, a schematic diagram illustrating a semiconductor memory apparatus shows a plurality of stacked semiconductor dies.

The semiconductor memory apparatus in an embodiment may include first to fourth semiconductor dies 110, 120, 130, and 140, which are stacked.

The first semiconductor die 110 may be electrically coupled to an interposer 200.

The second semiconductor die 120 may be stacked on the first semiconductor die 110.

The third semiconductor die 130 may be stacked on the second semiconductor die 120.

The fourth semiconductor die 140 may be stacked on the third semiconductor die 130. All of the first to fourth semiconductor dies 110, 120, 130, and 140 may store data, or the second and fourth semiconductor dies 120 and 140 among the first to fourth semiconductor dies 110, 120, 130, and 140 may store data. The first to fourth semiconductor dies 110, 120, 130, and 140 may be electrically coupled to each other.

One of the first to fourth semiconductor dies 110, 120, 130, and 140, for example the first semiconductor die 110 may include a first interface 111 electrically coupled to a controller 300 through the interposer 200. In addition, the first semiconductor die 110 may include a second interface 112 electrically coupled to an external device such as an external test device, through the interposer 200. The second interface 112 may include the delay control unit 112 described above with reference to FIGS. 2 and 3.

During a normal operation, each of the first to fourth semiconductor dies 110, 120, 130, and 140 may determine its operation mode in response to control signals transferred from the controller 300 through the interposer 200 and the first interface 111.

During a test operation, a test control signal, which may be transferred from the external device through the interposer 200 and the second interface 112, may be delayed and inputted to the first to fourth semiconductor dies 110, 120, 130, and 140, and each of the first to fourth semiconductor dies 110, 120, 130, and 140 may also determine its operation mode according to the inputted test control signal.

As described with reference to FIGS. 2 and 3, the second interface 112 may determine input timing of the test control signal DA_infe to the first to fourth semiconductor dies 110, 120, 130, and 140 in response to the test mode signals TEST, or TEST1, TEST2, and TEST3. In other words, the delay control unit 113 included in the second interface 112 may determine delay amounts of the test control signal DA_infe for each of the first to fourth semiconductor dies 110, 120, 130, and 140 according to the test mode signals TEST, or TEST1, TEST2, and TEST3.

For example, as described with reference to FIG. 4, it is assumed that the test control signal DA_infe is inputted to the first to fourth semiconductor dies 110, 120, 130, and 140 for sequential active, write, precharge, read, precharge, and refresh operations of the first to fourth semiconductor dies 110, 120, 130, and 140 in order.

The first semiconductor die 110 shown in FIG. 5, which may correspond to the first data storage region 120 shown in FIG. 1, may be configured to work with the same timing of the test control signal DA_infe.

The second semiconductor die 120 shown in FIG. 5, which may correspond to the second data storage region 130 shown in FIG. 1, may be configured to work with a time lag behind the first semiconductor die 110.

The third semiconductor die 130 shown in FIG. 5, which may correspond to the third data storage region 140 shown in FIG. 1, may be configured to work with a time lag behind the second semiconductor die 120.

The fourth semiconductor die 140 shown in FIG. 5 may be configured to work with a time lag behind the third semiconductor die 130.

The first to fourth semiconductor dies 110, 120, 130, and 140 may perform different operations from each other at a specific time point T1.

As such, in accordance with various embodiments, the semiconductor memory apparatus described above with reference to FIGS. 1 to 3 may be applied to the semiconductor memory device having the plurality of stacked semiconductor dies described above with reference to FIG. 5.

Figure 6:
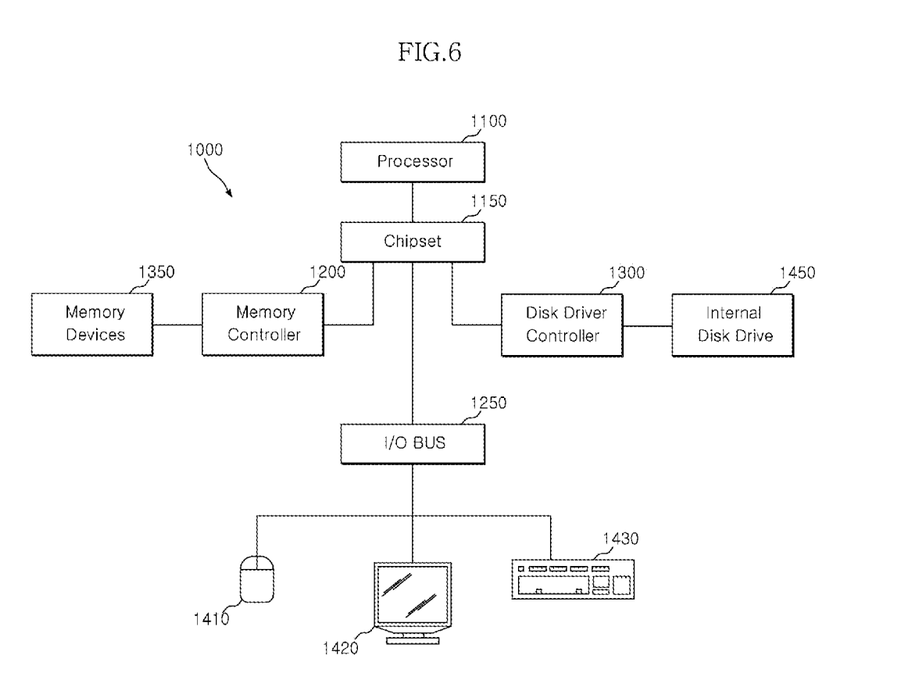
FIG. 6 illustrates a block diagram of a system employing a memory controller circuit in accordance with an embodiment of the invention.

Referring to FIG. 6, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor memory device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset using virtually any type of communication protocol.

While certain embodiments have been described above, it will be understood to those skilled in the art that the embodiments described are by way of example only. Accordingly, the semiconductor memory apparatus should not be limited based on the described embodiments. Rather, the semiconductor memory apparatus described should only be limited in light of the claims that follow when taken in conjunction with the above description and accompanying figures.

What is claimed is:

1. A semiconductor memory apparatus comprising:
a plurality of data storage regions;
a first internal circuit configured to input a plurality of control signals to the plurality of data storage regions; and
a second internal circuit configured to control input timing of a test control signal, and input the test control signal to the plurality of data storage regions according to the controlled input timing in response to a test mode signal,
wherein the first internal circuit includes a first interface directly coupled to an external controller and configured to receive the plurality of control signals from the external controller, and
wherein the second internal circuit includes a second interface directly coupled to an external test device, and configured to receive the test control signal from the external test device.

2. The semiconductor memory apparatus of claim 1, wherein the second internal circuit comprises:
a delay control unit configured to control the input timing of the test control signal to be inputted to each of the plurality of data storage regions in response to the test mode signal.

3. The semiconductor memory apparatus of claim 2, wherein the delay control unit inputs the test control signal to each of the plurality of data storage regions with different input timings in response to the test mode signal.

4. The semiconductor memory apparatus of claim 3, wherein the delay control unit comprises:
a delay chain including a plurality of delay units serially coupled; and
a selection unit configured to select each output of the plurality of delay units, and output the selected output to each of the plurality of data storage regions in response to the test mode signal,
wherein the delay chain receives the test control signal.

5. The semiconductor memory apparatus of claim 2, wherein the delay control unit is one of a synchronized delay control unit to work in synchronization with a clock, and a non-synchronized delay control unit to work without synchronization to the clock.

6. The semiconductor memory apparatus of claim 2, wherein the delay control unit comprises:
a plurality of delay chains, each of which includes a plurality of serially coupled delay units; and
a plurality of selection units, each of which outputs an output of the plurality of delay units included in a corresponding one of the plurality of delay chains,
wherein the plurality of delay chains receive the test control signal.

7. A semiconductor memory apparatus comprising:
a plurality of data storage regions;
a normal signal transfer path configured to set operation modes to each of the plurality of data storage regions; and
a test signal transfer path configured to control the plurality of data storage regions to enable the plurality of data storage regions to perform operations with the same pattern while the plurality of data storage regions perform different operations to each other at the same time in a test mode,
wherein the normal signal transfer path includes a first interface directly coupled to an external controller, and
wherein the test signal transfer path includes a second interface directly coupled to an external test device.

8. The semiconductor memory apparatus of claim 7, wherein the normal signal transfer path receives a plurality of control signals to individually set operation mode of each of the plurality of data storage regions from the external controller, and input the plurality of control signals to the plurality of data storage regions.

9. The semiconductor memory apparatus of claim 7, wherein the test signal transfer path receives a test control signal to set an operation mode of the plurality of data storage regions from the external test device, delay the test control signal with different delay amounts for each of the plurality of data storage regions, and input the delayed test control signal to each of the plurality of data storage regions.

10. The semiconductor memory apparatus of claim 9, wherein the test signal transfer path determines the delay amounts of the test control signal in response to a test mode signal.

11. The semiconductor memory apparatus of claim 10, wherein the test signal transfer path comprises:
a plurality of delay units, which are serially coupled;
a selection unit configured to transfer an output of the plurality of delay units to one of the plurality of data storage regions in response to the test mode signal.

12. A semiconductor memory apparatus comprising a plurality of stacked semiconductor dies,
wherein one of the plurality of stacked semiconductor dies comprises:
a first interface electrically configured to individually set an operation mode of each of the plurality of stacked semiconductor dies under control of an external controller in a normal mode; and
a second interface configured to receive a test control signal from an external test device, delay the test control signal with different delay amounts for each of the plurality of stacked semiconductor dies, and input the delayed test control signal to each of the plurality of stacked semiconductor dies in a test mode,
wherein the first interface is directly coupled to the external controller, and the second interface is directly coupled to the external test device.

13. The semiconductor memory apparatus of claim 12, wherein the second interface comprises:
a delay control unit configured to determine the delay amounts of the test control signal, and respectively input delayed test control signals having different delay amounts to the plurality of stacked semiconductor dies in response to a test mode signal.

14. The semiconductor memory apparatus of claim 13, wherein the delay control unit comprises:
a delay chain including a plurality of delay units which are serially coupled and delay the test control signal; and
a selection unit configured to select each output of the plurality of serially coupled delay units, and output the selected output to each of the plurality of stacked semiconductor dies in response to the test mode signal.

15. The semiconductor memory apparatus of claim 12, wherein each of the plurality of stacked semiconductor dies work through different channels.

* * * * *